United States Patent [19]

Milligan et al.

[11] Patent Number: 5,604,414
[45] Date of Patent: Feb. 18, 1997

[54] METHOD AND APPARATUS FOR ADJUSTING OVERLOAD COMPENSATION FOR A WATTHOUR METER

[75] Inventors: James W. Milligan, West Lafayette; John T. Voisine, Lafayette, both of Ind.

[73] Assignee: Landis & Gyr Energy Management, Lafayette, Ind.

[21] Appl. No.: 307,297

[22] Filed: Sep. 15, 1994

[51] Int. Cl.⁶ .................. G01R 11/32; G01R 11/21
[52] U.S. Cl. ......................... 318/632; 324/142
[58] Field of Search ................ 318/632; 324/126, 324/127, 142, 110; 323/357

[56] References Cited

U.S. PATENT DOCUMENTS

| | | | |
|---|---|---|---|
| 4,083,000 | 4/1978 | Becker | 324/137 |
| 4,182,982 | 1/1980 | Wolf et al. | 324/127 |
| 4,255,704 | 3/1981 | Milkovic | 324/127 |
| 4,278,940 | 7/1981 | Milkovic | 324/127 |
| 4,492,919 | 1/1985 | Milkovic | 324/127 |
| 4,794,333 | 12/1988 | Milkovic | 324/142 |
| 5,066,904 | 11/1991 | Bullock | 324/127 |

*Primary Examiner*—Jonathan Wysocki
*Attorney, Agent, or Firm*—Woodard, Emhardt, Naughton, Moriarty & McNett

[57] ABSTRACT

An apparatus for electrically setting the overload compensating magnetic reluctance in a single phase induction watthour meter includes a moveable magnetic shunt positioned adjacent the poles of a current core of a current stator circuit. An electrical parameter of the current stator circuit is sensed and changes in this parameter are used to set the air gap between the magnetic shunt and the current core poles. In one embodiment, a programmable controller controls a motor to move the shunt in response to variation of the sensed electrical parameter from a predetermined value. In one method, the sensed electrical parameter is the voltage induced in a first current coil when a second current coil is energized. In other methods, the sensed electrical parameter is the flux induced in the magnetic shunt or the self inductance of a current coil. A further method is to determine the ration of a harmonic voltage to a fundamental voltage which corresponds to the desired degree of magnetic saturation of the overload compensator at the control point.

9 Claims, 9 Drawing Sheets

5,604,414

METHOD AND APPARATUS FOR ADJUSTING OVERLOAD COMPENSATION FOR A WATTHOUR METER

BACKGROUND OF THE INVENTION

The present invention concerns induction type watthour meters for measuring alternating current electrical energy consumed by a load. In particular, the invention concerns watthour meters utilizing an overload compensation to achieve accurate readings at higher power loads.

A typical induction watthour meter consists of a rotor with integral conductive disk and a stator which induces currents in the conductive disk to which it is magnetically coupled. The stator consists of a potential stator energized by the line voltage and a current stator energized by load current. Torque is developed in the meter's conductive disk as a function of the magnitude of the product of the eddy currents induced in the disk by magnetic flux generated by both the potential and current stators. The developed torque is also proportional to the sine of the electrical phase angle between the two eddy current inducing magnetic fluxes.

While the watthour meter is typically very accurate over a wide range of loads, there must be compensation for a variety of factors which affect the accuracy of the meter. These compensations are built into the meter and provide corrections needed to make the meter register accurately under variations of load, temperature, frequency, and voltage. In particular, this invention relates to overload compensation in an induction watthour meter. A watthour meter must have overload compensation to integrate accurately at loads up to the maximum load as established by its class range.

The major factor requiring overload compensation is the increased damping of the disk caused by the increasingly significant magnitude of current flux at overloads. Thus at class load, the current flux damping may approach or exceed 10% of the total drag on the disk, causing the meter to have a negative error approaching 10% or greater. The static torque of the non-overload compensated meter is essentially linear throughout the range of overload currents. However, damping or drag at high currents (overload) causes the negative registration error of the meter to increase at overload.

To compensate for the increasing registration error with increasing loads in an uncompensated meter on overload, a magnetic shunt is held in place adjacent, but not touching, the poles of the current core of the current stator by a non-magnetic bracket. This shunt has little effect on overload compensation below the load at which the accuracy curve of the meter would otherwise start to drop. But, as the load increases, the shunt approaches saturation causing the current flux which cuts the disk to increase at a greater rate than the current.

Previous methods for providing the appropriate overload compensation of the watthour meter have relied on placing the magnetic shunt a pre-set distance from the poles of the current core. This set distance is known as the air gap and is determined experimentally to provide, on average, the appropriate overload compensation for the watthour meter. Once the air gap is established which provides the desired overload compensation for a class of meters, all meters within that class will have the same air gap, within the tolerances of the placement mechanisms.

However, placing the magnetic shunt a set distance from the poles of the current core has several drawbacks which the present invention improves upon or eliminates. Mechanically setting the distance of the air gap between the magnetic shunt and current core does not always provide the correct overload compensation. Mechanically setting the distance does not account for the effects of such factors as paint thickness, material thickness, stamping variations such as edge burr, roll-over, shear, and break area on the magnetic reluctance of the overload compensator air gap. Also, the ability to consistently hold a very small air gap to within the desired tolerance is not considered very practical in large volume production without the use of expensive close tolerance non-magnetic spacers. Setting of the overload compensator air gap as described herein compensates for minor variations that may occur in overload compensator magnetics or the magnetic induction at which the overload compensator approaches magnetic saturation.

SUMMARY OF THE INVENTION

The present invention contemplates an induction type watthour meter connected to a source of AC line current and voltage for measuring AC electrical energy consumption by a load. The meter includes a current stator circuit and a voltage stator circuit, which operate together to drive the conductive disk of the induction watthour meter. The current stator circuit includes a current core wound with at least one current coil. The current core has two poles and positioned adjacent those poles, but not in contact thereby creating an air gap, is a magnetic shunt which provides overload compensation.

The invention contemplates setting the overload compensation in the watthour meter in response to variations of predetermined electrical parameters. An electrical parameter is selected which varies due to the change in magnetic response of the current stator caused by adjusting the overload compensator air gap. A value for the selected parameter is determined which corresponds to the desired overload compensation of the meter.

The current stator circuit is then energized while sensing the electrical parameter. The position of the magnetic shunt, in relation to the current core poles, is adjusted until the desired value for the electrical parameter is reached.

It is one object of the invention to provide a more accurate means for producing the desired overload compensation which is not affected by the physical characteristics or material properties of the magnetic shunt. Further objects and benefits of the invention will become apparent from the following written description in conjunction with the accompanying figures.

DESCRIPTION OF THE PREFERRED EMBODIMENTS

Figure 1:
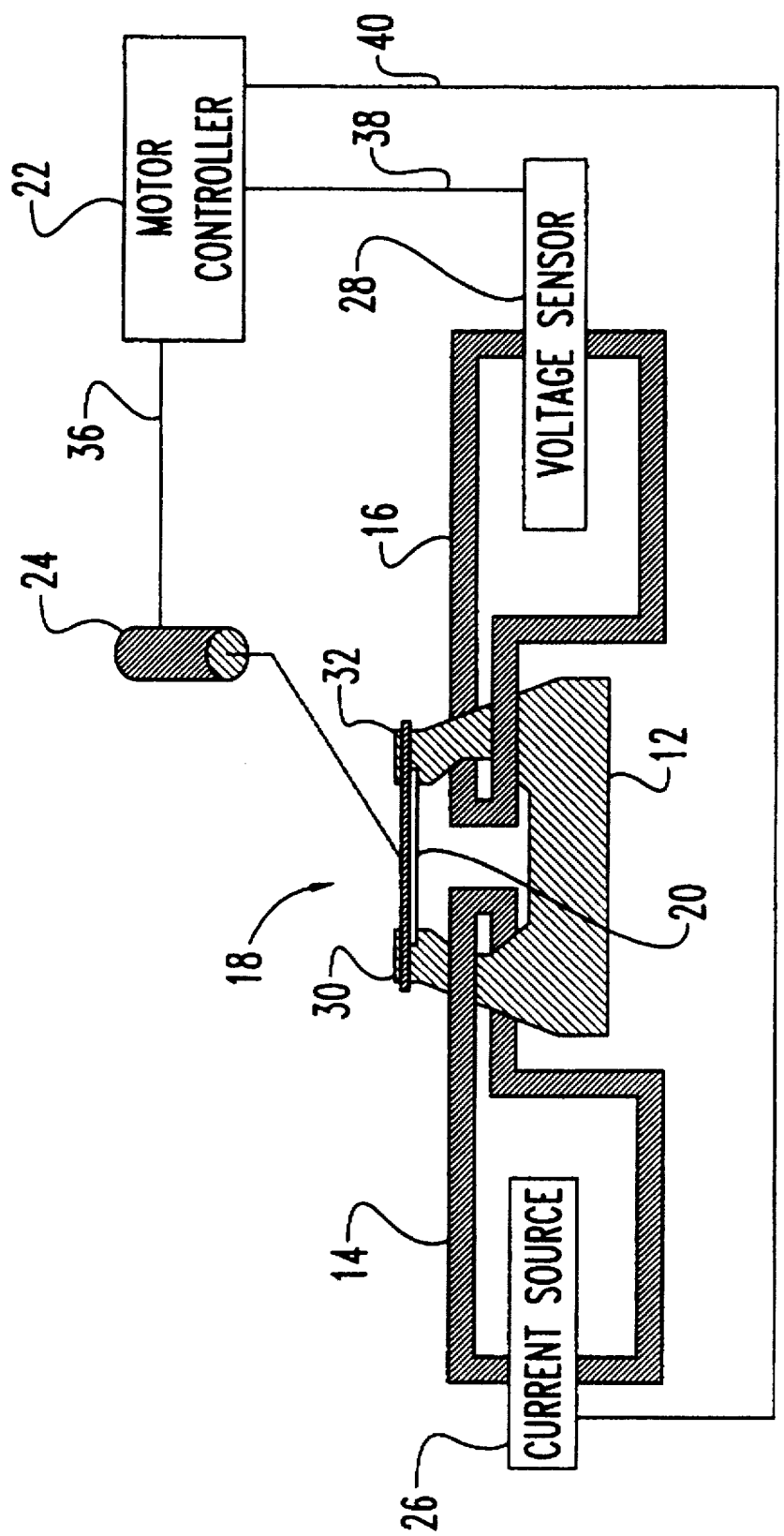
FIG. 1 is a diagrammatic illustration of a current stator circuit with corresponding sensors and controls in accordance with the present invention.

For the purpose of promoting an understanding of the principles of the invention, reference will now be made to preferred embodiments and specific language will be used to describe the same. It will nevertheless be understood that no limitation of the scope of the invention is thereby intended, such alterations and further modifications in the illustrated embodiments, and such further applications of the principles of the invention as illustrated herein being contemplated as would normally occur to one skilled in the art to which the invention pertains.

The present invention contemplates an apparatus which sets the overload compensation for induction watthour meters by sensing an electrical parameter of the current stator circuit and positioning a magnetic shunt adjacent to the poles of the current core, in a position corresponding to predetermined value for a desired electrical parameter. The current stator circuit of the induction watthour meter, shown in FIG. 1, includes a first current coil 16 and a second current coil 14 wound around a current core 12. It is contemplated that if the meter type employs only one current coil that the first current coil 16 may be temporarily added to perform the setting of overload compensation and then removed from the meter. A magnetic shunt 18 is positioned adjacent to current core poles 30, 32.

Figure 2:
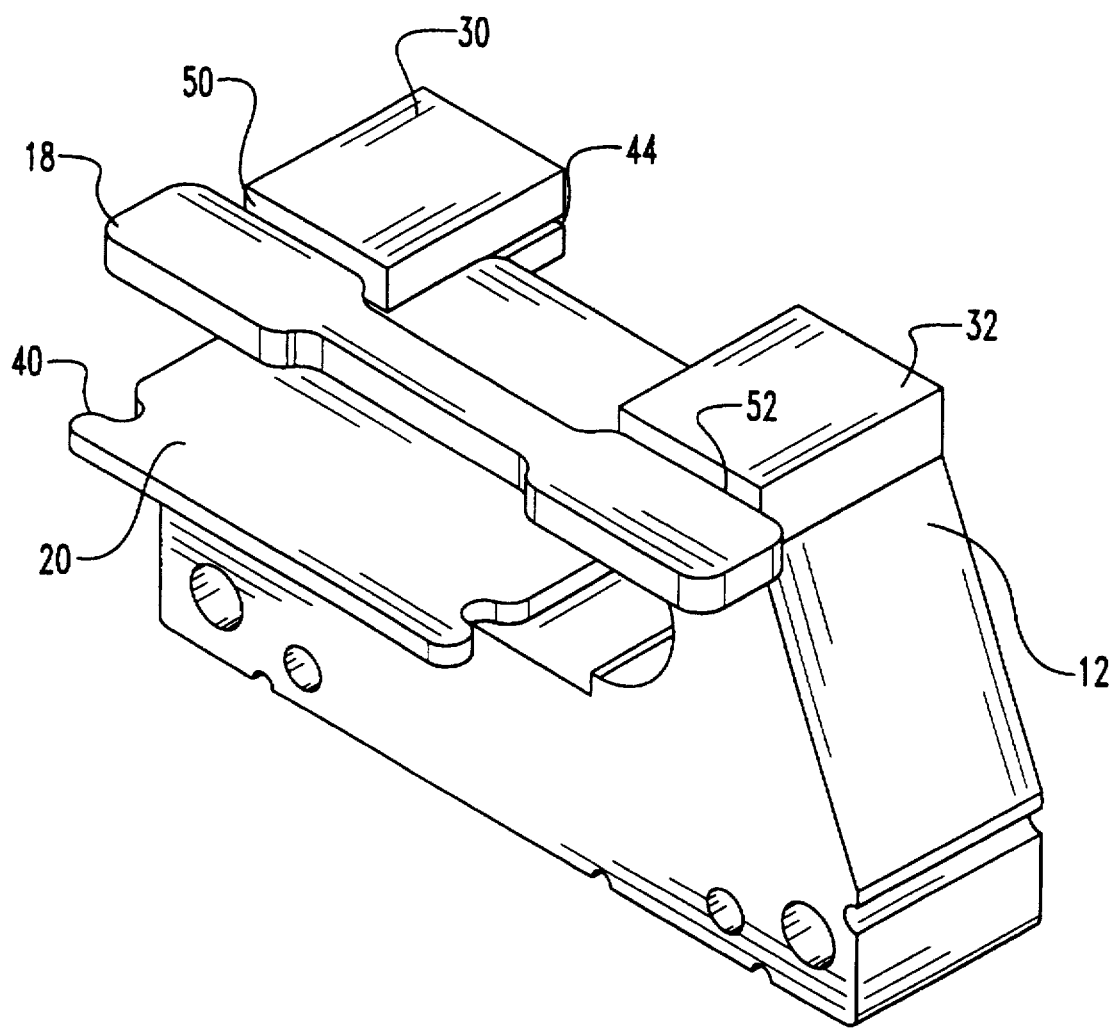
FIG. 2 is a top plan view showing the current core, mounting bracket, and magnetic shunt.
Figure 3:
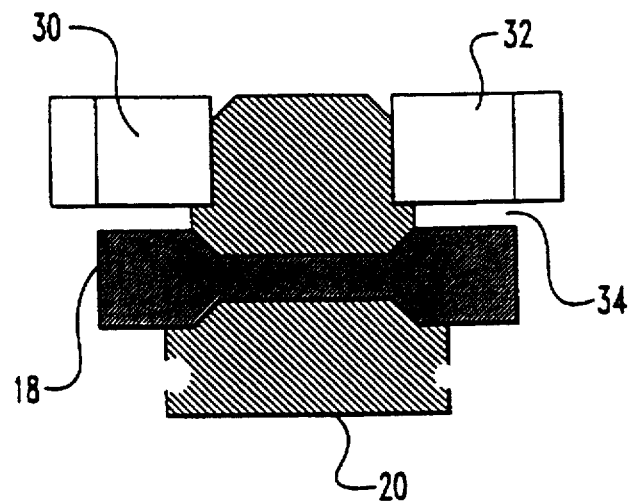
FIG. 3 is a top view of FIG. 2 illustrating the air gap between the magnetic shunt and the current core.

Referring now to FIGS. 2 and 3, the magnetic shunt 18 is attached to a non-magnetic mounting bracket 20 which can slide within the current core 12 along grooves 44 formed in the legs of current core 12 terminating in poles 30, 32 (the groove formed in leg terminating in pole 32 is not shown). Accurate, controlled movement of bracket 20 in grooves 44 permits the precise location of the magnetic shunt 18 in relationship to pole faces 50, 52 of current core 12. The air gap 34 (FIG. 3) between magnetic shunt 18 and pole faces 50, 52 determines the amount of magnetic shunting that affects the magnitude of overload compensation.

Figure 4:
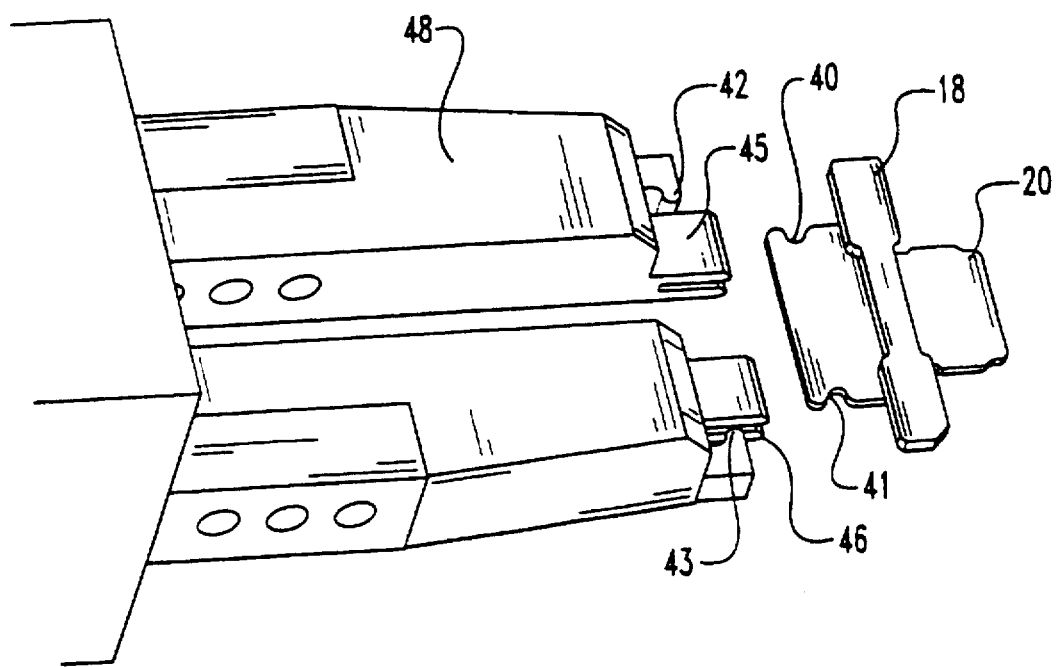
FIG. 4 is a top plan view showing the gripper mechanism in an open position and the mounting bracket.

In a preferred method of controllably adjusting the meter's overload compensation, positioning of the mounting bracket 20 is controlled by a motor controller 22 (FIG. 1). Motor controller 22 is preferably a programmable controller capable of performing operations on analog signals. However, it is contemplated that it could be an analog device in which resistors could be changed to produce different voltages for different meters types. The motor controller 22 controls motor 24 which is removably attached to the mounting bracket 20 by the gripper mechanism 48, shown in FIG. 4. Slides 45 and 46 maintain alignment of the gripper mechanism 48 with the mounting bracket while protrusions 42 and 43 are removably received within notches 40 and 41 on the mounting bracket 20. The protrusions 42, 43 and corresponding notches 40, 41 allow the gripper mechanism 48 to grip the mounting bracket 20.

Figure 5:
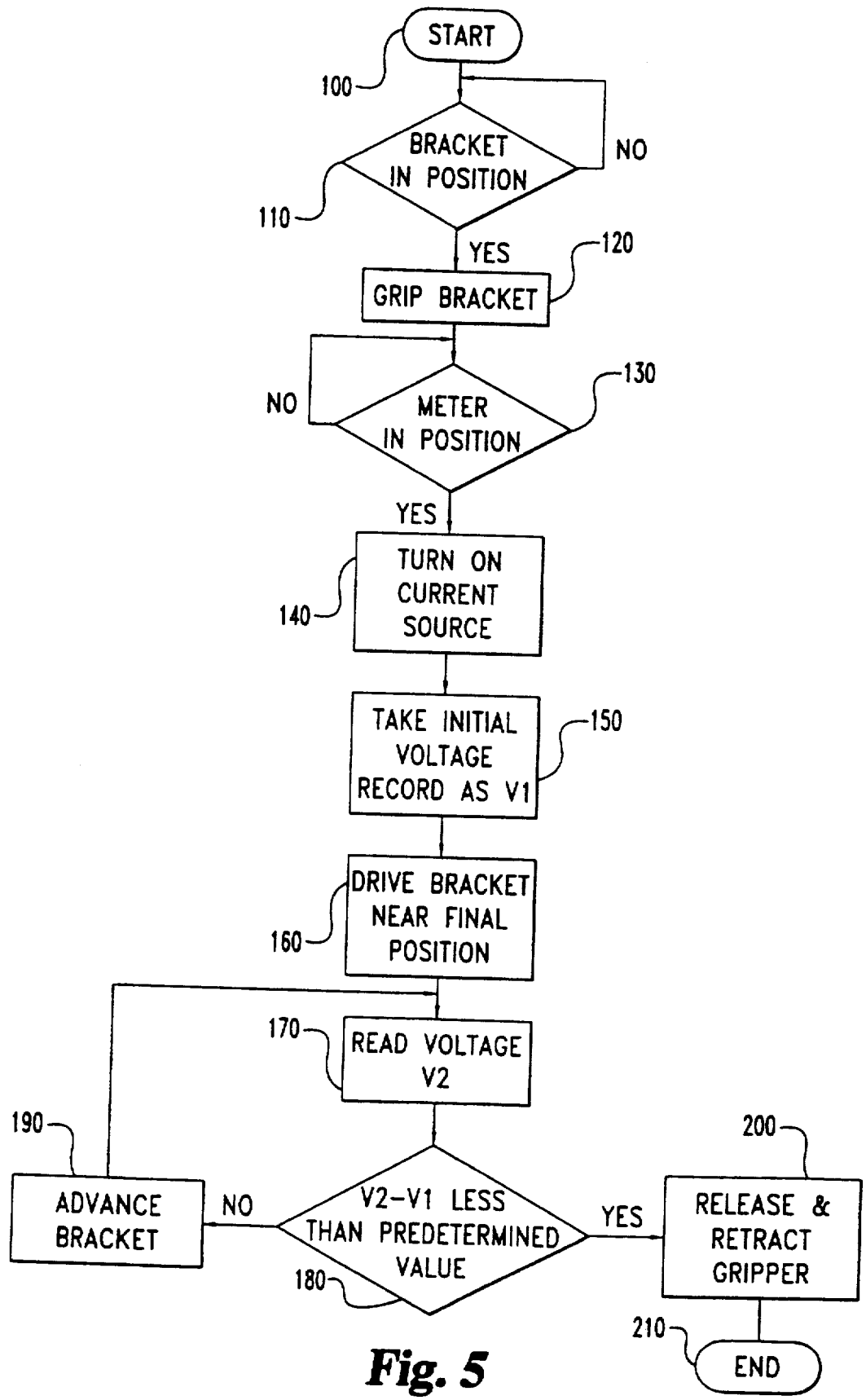
FIG. 5 is a flow chart showing the steps of the motor controller in setting the overload compensation.

The motor controller 22 adjusts the meter's overload compensation according to the flowchart shown in FIG. 5. The procedure begins at step 100 in which the program is started and sensors initialized. At step 110, the controller can determine if a mounting bracket is positioned in a storage tray, ready to be gripped by the gripper mechanism. If a mounting bracket with an overload compensator 18 attached is not in position the controller waits until a mounting bracket is properly positioned. Once the motor controller receives a signal indicating that a mounting bracket is properly positioned, the controller controls the gripper mechanism 48 to grip the mounting bracket at step 120. The controller then waits at step 130 until a meter is properly positioned so that the mounting bracket may be inserted into the meter. Once the controller receives a signal that the meter is properly positioned, it energizes a current source 26, step 140. Since current source 26 is electrically connected to the second current coil 14, it energizes the current stator circuit. Prior to inserting the mounting bracket and its overload compensator, an initial voltage reading is taken from the voltage sensor 28 connected to the first current coil 16 and recorded as reference voltage V1.

Once the reference voltage has been recorded, the motor controller 22 controls the motor 24 to drive the mounting bracket 20 into grooves 44 a predetermined distance, which is near the final position of the mounting bracket. A voltage reading is taken from voltage sensor 28 connected to the first current coil 16 and the difference between the first voltage reading V1 and the second voltage reading V2 is compared to a predetermined voltage value. If the difference between the voltages (V2−V1) is less than the predetermined voltage value the bracket is advanced, bringing the magnetic shunt 18 closer to the pole faces 50, 52. Advancing the bracket and overload compensator progressively lowers the magnetic reluctance of this portion of the magnetic circuit, which reduces the reluctance seen by the current core leading to a corresponding increase in the voltage induced in the first current core. The process of advancing the bracket and comparing the difference between V1 and V2 to the predetermined voltage is continued until a voltage difference slightly greater than the predetermined value is received.

Once a voltage difference which is slightly greater than the predetermined voltage is obtained, the gripper mechanism 48 is removed from the bracket and the meter is properly compensated to provide accurate measurements at high load currents. The mounting bracket 20 and magnetic shunt 18 are maintained in position relative to the current core 12 by means of an interference fit between the mounting bracket 20 and grooves 44. Additional securing means such as adhesive could also be employed.

Figure 6:
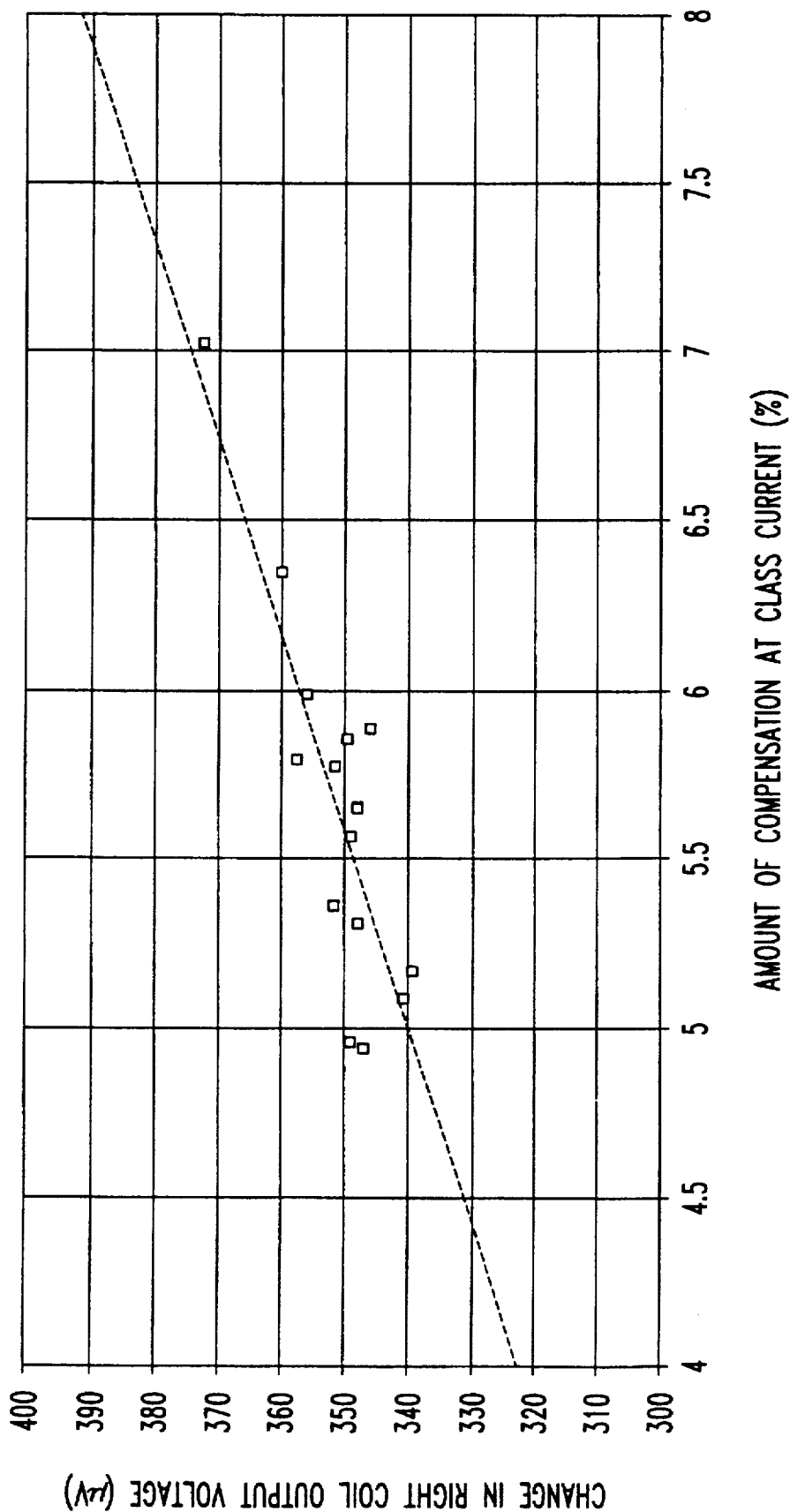
FIG. 6 is a graph showing the change in first current coil voltage versus the amount of compensation in the watthour meter when current stator circuit is energized at the class current.

The amount of compensation desired for one type of meter, the Landis & Gyr Type MX Class 200, is approximately 5.5%, which is accomplished by making the voltage difference (V2−V1) equal 350 microvolts. FIG. 6 shows the amount of compensation achieved when the air gap is adjusted to provide approximately the desired change in first coil 16 induced voltage.

Figure 7:
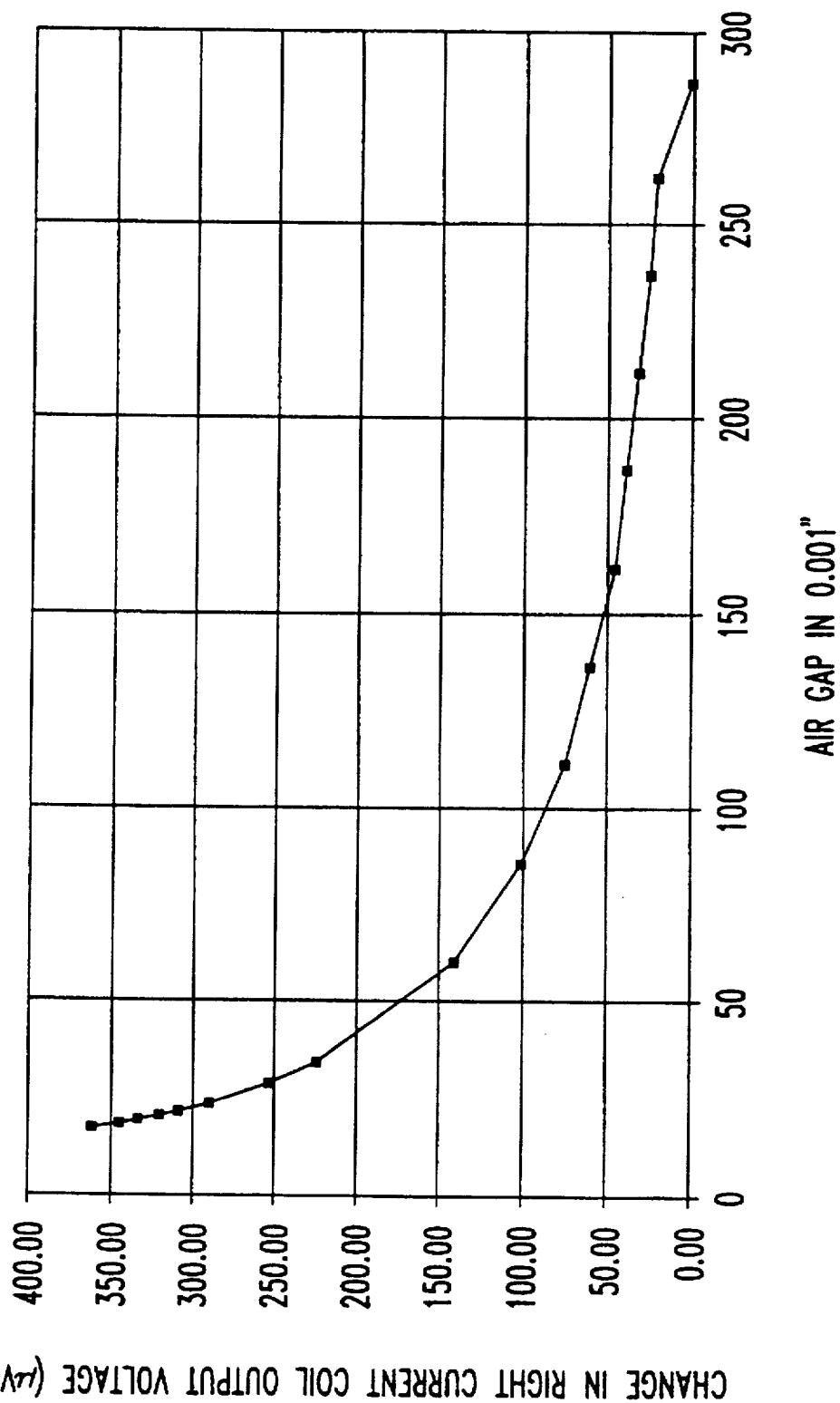
FIG. 7 is a graph showing the change in first current coil voltage versus the air gap between the magnetic shunt and the current core poles.
Figure 8:
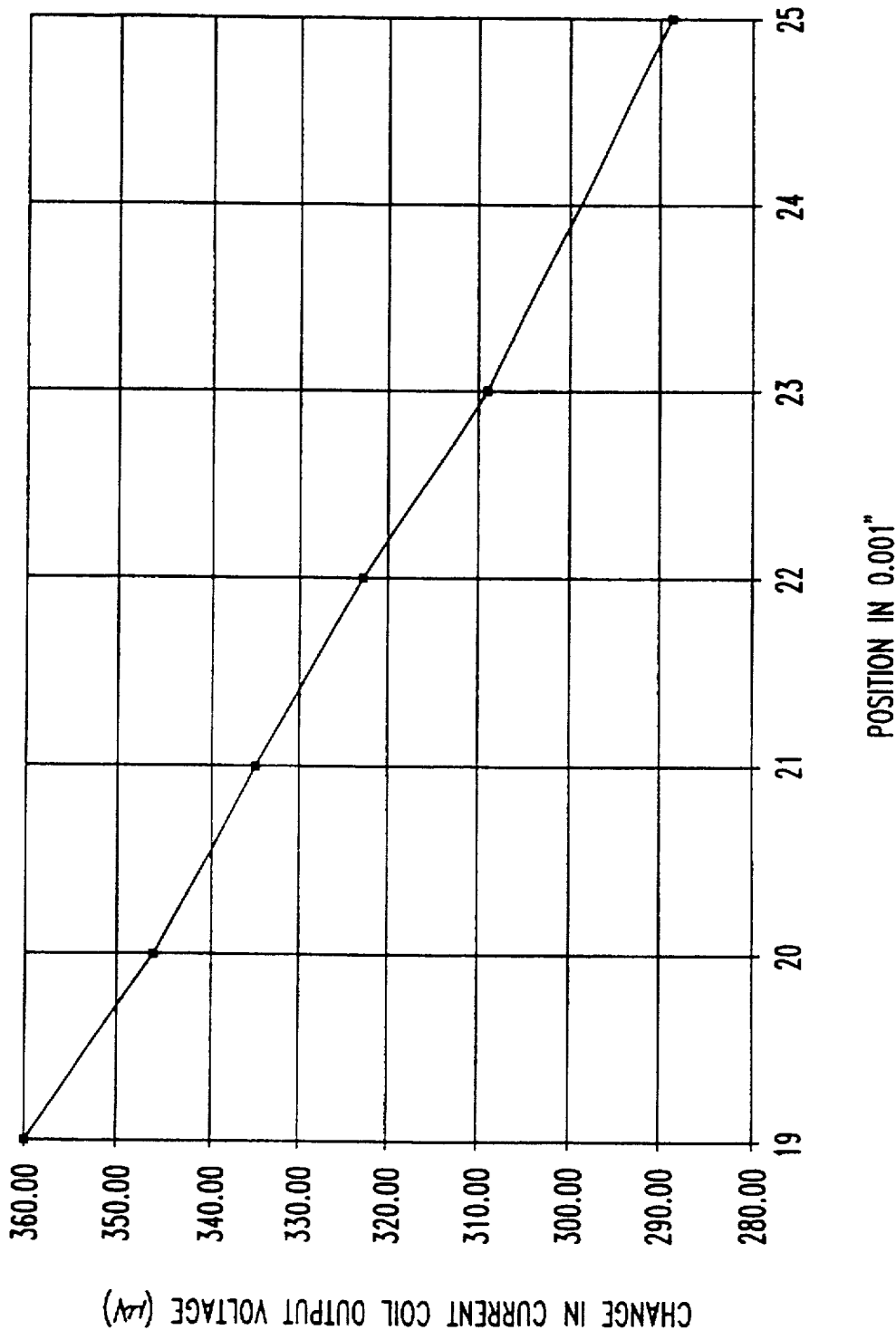
FIG. 8 is a more detailed version of the graph in FIG. 7, showing the change in the current coil induced voltage versus the position of the air gap in smaller increments.

During the operation of the apparatus in FIG. 1, the motor controller 22 activates the current source 26 to energize the second current coil 14 with desired load current. The motor controller 22 then sends a control signal on line 36 to the insertion motor 24 to change the position of the mounting bracket 20 and thereby change the air gap between the magnetic shunt 18 and the poles faces 50, 52. The insertion motor 24 moves the non-magnetic mounting bracket 20, with attached magnetic shunt 18, along grooves 44. As the magnetic shunt approaches the poles faces 50, 52 of the current core, the air gap reluctance begins to decrease. The decrease in air gap reluctance results in an increase in current core induction and a subsequent increase in the first current coil 16 voltage. FIGS. 7 and 8 show the change in the first current coil voltage induced by the current core flux as the air gap between the magnetic shunt 18 and the pole faces 50, 52 of the current core legs adjacent poles 30, 32, is reduced, in the meter of the specific illustrated embodiment. As the air gap between magnetic shunt 18 and the pole faces 50, 52 is reduced, the permeance of the magnetic circuit of the current stator is increased, thereby increasing the magnetic induction in the current core that induces a voltage in the first current coil.

Figure 9:
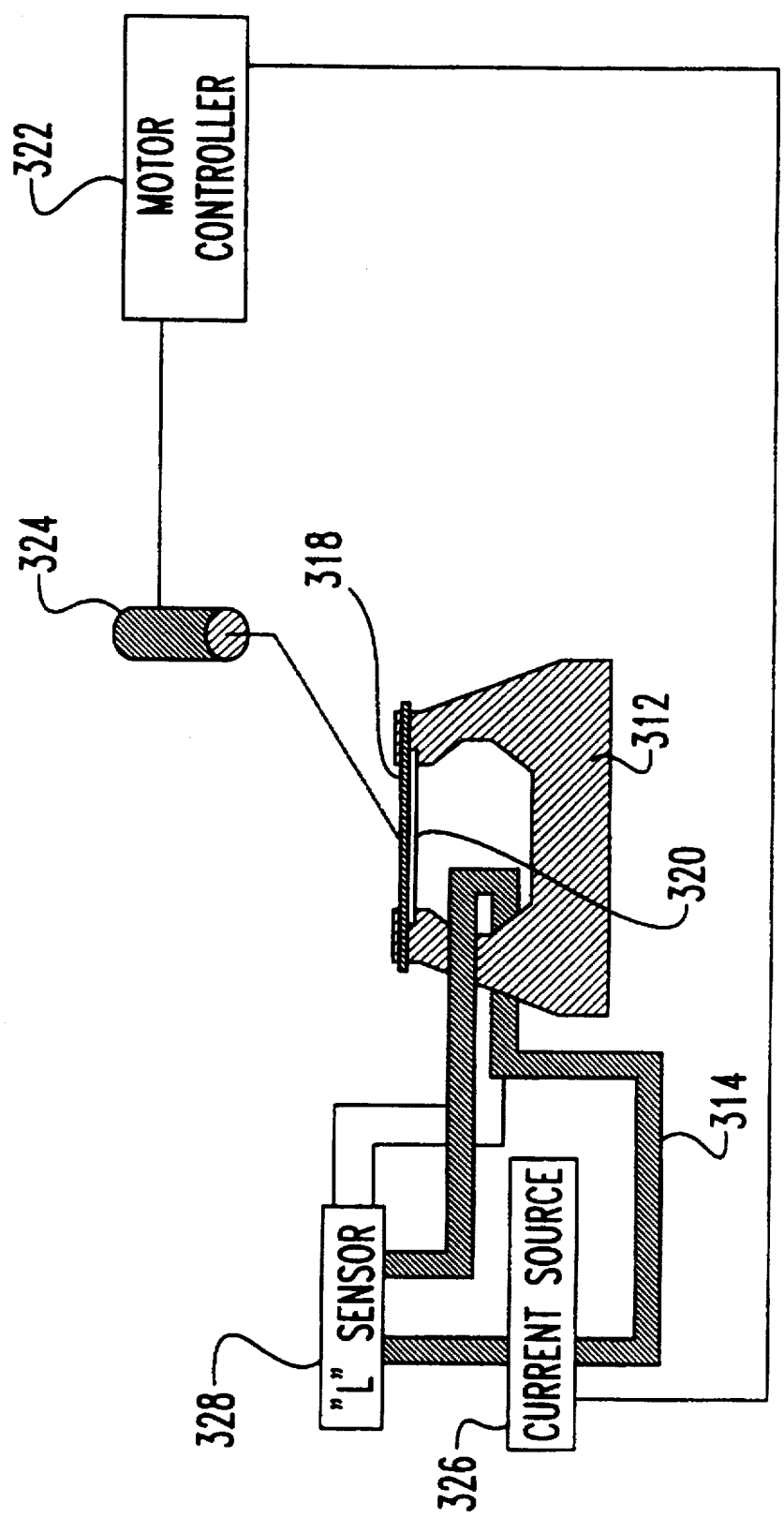
FIG. 9 is a diagrammatic illustration of a current stator circuit with one current coil and the corresponding sensors and controls in accordance with another embodiment of the present invention.

A further apparatus for setting the desired air gap to provide overload compensation is shown in FIG. 9 This apparatus senses the change in self inductance of the current stator. While only one coil is shown, it is contemplated that the core could be wound with two coils, connected in series. The motor controller 322 controls the apparatus of FIG. 9 in a similar manner to that described for the apparatus of FIG. 1. The controller activates current source 326 to energize current coil 314 and thereby energize current core 312. Induction sensor 328 provides an intial reading to the controller 322, prior to the insertion of the magnetic shunt. (Alternatively, the induction sensor could be replaced with a VAR meter). The inductance of the current stator, operating as an inductor, will increase as the current core 312 is magnetically loaded by the magnetic shunt 318. This change in inductance can be sensed by the induction sensor 328 and is used to control the air gap between the magnetic shunt 18 and the pole faces 50, 52. The controller 322 controls the motor 324 to advance the mounting bracket 320 until a predetermined value for self inductance is slightly exceeded. Once the predetermined value is reached, the mounting bracket and magnetic shunt are in the proper position to provide overload compensation at high load current. The proper value for self inductance of the current circuit is determined experimentally for each type and class of meter.

Another method of setting the overload compensator air gap is to use the flux induced into the magnetic shunt as a guide to determine the desired position of the magnetic shunt 18. This method senses the flux induced in magnetic shunt 18 to establish the air gap between the shunt and pole faces 50, 52, required to compensate the load curve at high loads. The flux induced in shunt 18 is an inverse functiuon of the shunt air gap and can be correlated to the shunt's contribution to the load curve compensation. In this method, the current core acts as a source of magneto motive force or magnetic pressure causing magnetic flux to flow across the shunt air gap and through magnetic shunt 18.

Figure 10:
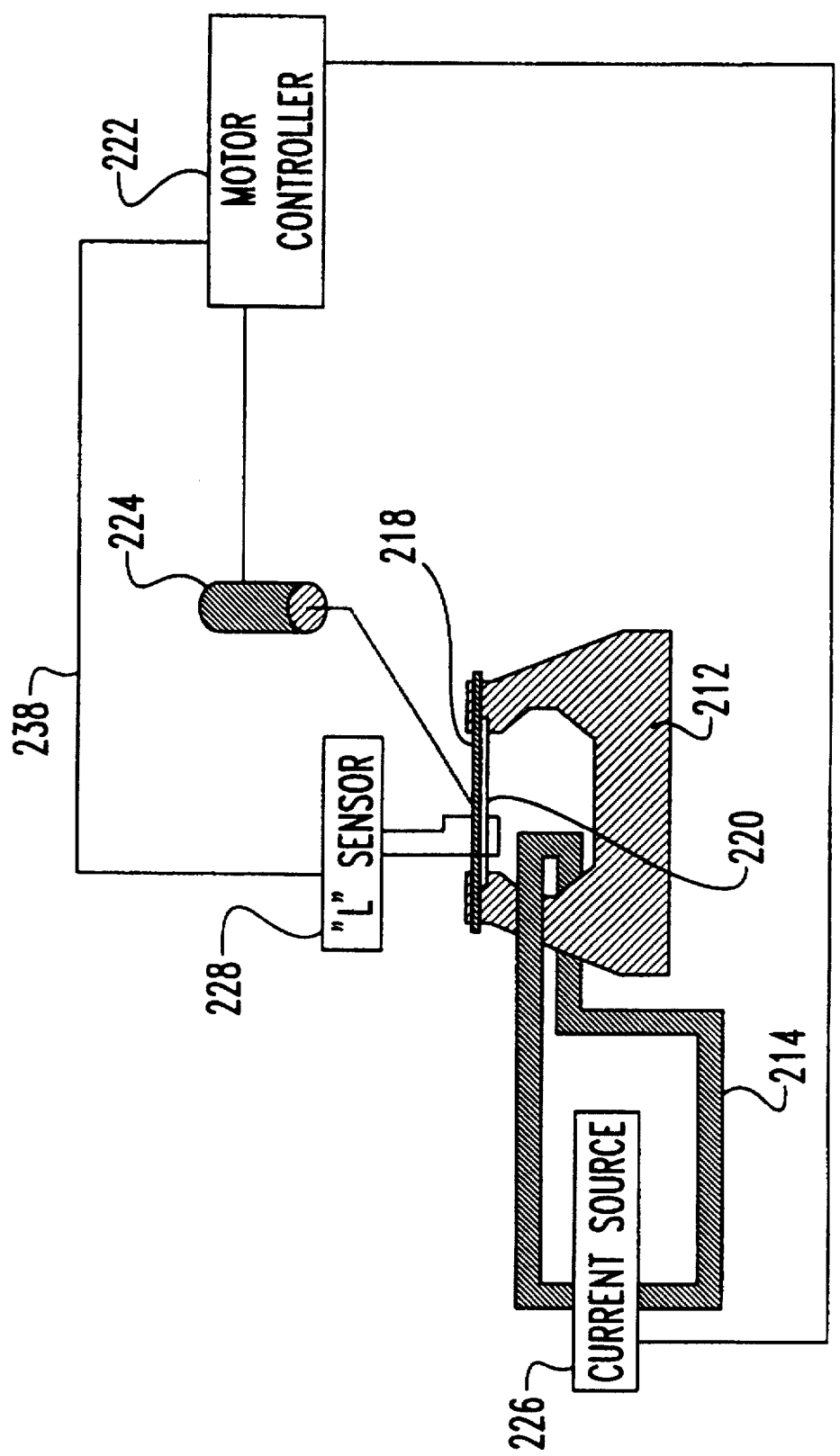
FIG. 10 is a diagrammatic illustration of a current stator circuit with one current coil with corresponding sensors and controls in accordance with another embodiment of the present invention.

The same induction type watthour meter as shown in FIG. 9 is attached to a sensing apparatus as shown in FIG. 10. The apparatus of FIG. 10 is similar to the apparatus of FIG. 9, except that the magnetic induction in the magnetic shunt 218 is now sensed. A current source 226 is connected to the current coil 214 and is controlled by the motor controller 222 as stated above. The magnetic induction sensor 228 is connected to the magnetic shunt 218 and provides a signal to the motor controller 222 along signal path 238. With current core 212 energized by current source 226, the motor 224 advances the mounting bracket 220 until the desired value of magnetic induction of the magnetic shunt is received. This method permits the setting of the overload compensated air gap to provide a predetermined flux level in both the current core and the magnetic shunt, thereby maximizing the control of the high end load curve.

Yet another method contemplated for sensing the desired air gap for the overload compensator is to measure the degree of saturation in the magnetic shunt 18. This method uses the same apparatus depicted in FIG. 10 and described above except that the magnetic induction sensor is replaced with a voltage sensor. The degree of saturation of the magnetic shunt 18 is determined by sensing and measuring the magnitude of lower frequency odd harmonics induced in the magnetic shunt.

The compensator air gap can be adjusted mechanically with the current stator energized as described above. When the low frequency odd harmonic voltage reaches a pre-established ratio with respect to the fundamental voltage, the overload compensator is in the proper position to provide accurate compensation at high load. One harmonic may be used to sense the degree of magnetic saturation in shunt, or several odd harmonics may be used. The range of useful harmonics may range up to the thirteenth although the range from the third to the seventh harmonic is the most useful. In addition, sensing of the magnitude of an odd harmonic without establishing its ratio with respect to its fundamental frequency can also be used to establish the degree of magnetic saturation of shunt 18. While the method above describes sensing the harmonics in the magnetic shunt, it will also be obvious to those skilled in the art that the method would also function by sensing the odd harmonics in the current stator excitation current.

While the invention has been illustrated and described in detail in the drawings and foregoing description, the same is to be considered as illustrative and not restrictive in character, it being understood that only the preferred embodiments have been shown and described and that all changes and modifications that come within the spirit of the invention are desired to be protected.

What is claimed is:

1. An apparatus for electrically setting the overload compensation of a current stator circuit for an induction type watthour meter having a current core wound with at least one current coil, and a magnetic shunt positioned adjacent to poles of the current core, comprising:

means for energizing the current stator circuit;

an electrical sensing device for sensing an electrical parameter of the current stator circuit when said current stator circuit is energized, said electrical sensing device producing a sensory signal corresponding to the sensed electrical parameter;

a motor, including a control input, with means for removably attaching to the magnetic shunt, said motor operable to change the position of the magnetic shunt in relation to the poles of the current core in accordance with a control signal supplied at said control input of said motor; and control means for controlling said motor in response to said sensory signal by calculating a desired position of said magnetic shunt based on said sensory signal, and sending a corresponding control signal to said control input of said motor, whereby said motor positions the magnetic shunt appropriately in response to said control signal.

2. The apparatus of claim 1 wherein said means for energizing is a current source and said electrical sensing device is a voltage sensor, said voltage sensor attached to a current coil to sense induced voltage.

3. The apparatus of claim 1, wherein said electrical sensing device consists of a magnetic induction sensor, said induction sensor being magnetically coupled to said magnetic shunt.

4. A method for electrically setting the overload compensation in a current stator circuit of an induction watthour meter, the method comprising the steps of:

determining an electrical parameter which varies in response to changes in magnetic response of the current stator circuit;

determining a value for said electrical parameter, said value corresponding to appropriate overload compensation of the current stator circuit;

energizing the current stator circuit;

sensing the electrical parameter; and adjusting the position of an overload compensator by controlling a motor in response to the sensed electrical parameter until said predetermined value for said electrical parameter is sensed, said motor having means for removably attaching to the overload compensator.

5. The method of claim 4 wherein the current stator circuit includes a current core with two poles and the overload compensator is a magnetic shunt which is positioned adjacent to said poles of the current core.

6. The method of claim 4, wherein the desired electrical parameter is a voltage value for a first current coil positioned around the current core, said voltage value corresponding to the desired overload compensating magnetic reluctance.

7. The method of claim 5, in which the desire electrical parameter corresponds to a flux value at a desired magnetic reluctance for the magnetic shunt.

8. The method of claim 4, in which the desired electrical parameter is a ratio of the low frequency harmonic voltage of said current stator circuit to the fundamental voltage of said current stator circuit, said ratio corresponding to a desired magnetic reluctance.

9. The method of claim 7 in which the desired electrical parameter is a ratio of one or more harmonic voltage of said current stator to the fundamental voltage of said current stator, said ratio corresponding to a desired magnetic reluctance.

\* \* \* \* \*